United States Patent [19]
Fulford, Jr. et al.

[11] Patent Number: 5,837,557
[45] Date of Patent: Nov. 17, 1998

[54] SEMICONDUCTOR FABRICATION METHOD OF FORMING A MASTER LAYER TO COMBINE INDIVIDUALLY PRINTED BLOCKS OF A CIRCUIT PATTERN

[75] Inventors: H. Jim Fulford, Jr.; Robert Dawson, both of Austin; Mark I. Gardner, Cedar Creek; Frederick N. Hause, Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[21] Appl. No.: 818,478

[22] Filed: Mar. 14, 1997

[51] Int. Cl.$^6$ ..................................................... H01L 21/82
[52] U.S. Cl. .................................. 438/6; 438/129; 438/599
[58] Field of Search ................................. 438/6, 128, 129, 438/598, 599

[56] References Cited

U.S. PATENT DOCUMENTS

| | | | |
|---|---|---|---|
| 4,969,029 | 11/1990 | Ando et al. | 438/129 |
| 5,252,507 | 10/1993 | Hively et al. | 438/6 |
| 5,252,508 | 10/1993 | Masuda | 438/6 |
| 5,444,000 | 8/1995 | Ohkubo et al. | 438/6 |

*Primary Examiner*—Chandra Chaudhari
*Attorney, Agent, or Firm*—Skjerven, Morrill, MacPherson, Franklin & Friel LLP; Ken J. Koestner

[57] ABSTRACT

Each circuit block of a plurality of circuit blocks on a semiconductor substrate is imaged in an exposure field defined by a reticle. The circuit blocks are separated and electrically isolated within the semiconductor substrate by an isolation such as a field oxide or trench isolation. The circuit blocks are globally interconnected by depositing a blanket metal layer, masking the metal layer and etching the metal layer using a stitching reticle having an exposure field overlapping the plurality of circuit blocks. The combination of reticle-imaged circuit blocks allows each individual circuit block to be fabricated independently, using independent imaging resolution, layout rules, design rules, different polysilicon sizes and source/drain region sizes and the like. In addition different reticles, including different reticle types, resolutions and qualities may be used to construct the various circuit blocks. Different imaging technologies may be used to construct the independent circuit blocks, including X-ray, I-line, H-line, ion-beam and electron-beam irradiation, for example. While the different circuit blocks are independently constructed, the circuit blocks are globally interconnected using the blanket metal layer so that overall circuit size is reduced, circuit quality is enhanced, fabrication time and costs are reduced, and performance is increased. A plurality of integrated chip sets, including microprocessor, memory, and support chips, are constructed on a single semiconductor wafer using separate reticle imaging of each of the plurality of integrated chip sets. The different circuits are globally interconnected using a blanket metal layer that is imaged using a stitch mask and etch operation that combines and electrically connects the individual integrated chips.

20 Claims, 9 Drawing Sheets

SEMICONDUCTOR FABRICATION METHOD OF FORMING A MASTER LAYER TO COMBINE INDIVIDUALLY PRINTED BLOCKS OF A CIRCUIT PATTERN

BACKGROUND OF THE INVENTION

1. Field of the Invention

The present invention relates to a method of integrated circuit manufacture. More specifically, the invention relates to a method of forming a master layer for combining a plurality of individually-printed reticle-image blocks of a circuit pattern.

2. Description of the Related Art

Integrated circuits are typically fabricated using photolithography techniques to produce a desired pattern from a photographic mask on a substrate material prior to a processing setup such as an etching step.

A photolithographic system for selectively irradiating a semiconductor wafer includes a radiation source, a lens or mirror and a mask or reticle. Photographic masks and photographic reticles are used to selectively pattern a semiconductor wafer. The mask and reticle differ in that a mask transfers a pattern onto an entire wafer in a single exposure. A reticle transfers a pattern onto only a portion of the wafer. In a photolithographic system that employs projection printing, the radiation source illuminates through the mask or reticle to the lens or mirror, and the lens or mirror focuses an image of the mask or reticle onto the photoresist coating of the semiconductor wafer.

One projection printing technique employs a projection scanner to transfer a pattern from a mask or reticle to a semiconductor wafer. The projection scanner uses a reflective spherical mirror to project an image onto a wafer by scanning the wafer and the mask with a narrow arc of radiation.

Another projection printing technique uses a step and repeat system, which is also called a stepper, to project an reticle image only onto a portion of the wafer. Multiple images of the reticle pattern are stepped and repeated over the entire wafer using multiple exposures. The reticle pattern is typically reduced 2× to 20× by the lens to form a small size but high-resolution image on the wafer surface, although non-reduction (1×) lens are available to cover a larger field on the wafer.

The term resolution refers to the ability of an optical system to distinguish closely spaced objects. The minimum resolution of a photolithographic system is the dimension of minimum linewidth or space that the system adequately prints or resolves. Optical photolithography currently attains a sub-micron resolution of $0.35\mu$ or less. Feature sizes approach $0.5\mu$ and below with the features extending across wafer areas of a square inch and more. To improve resolution various alternative technologies are under development, including electron-beam, ion-beam, and x-ray technologies. These alternative technologies have achieved patterning capabilities that exceed limits of optical systems. Electron-beams and ion-beams can also directly write image patterns onto the photoresist without the use of a mask or reticle, for instance by using a controlled stage to position the wafer beneath the tool. However, these alternative approaches have certain drawbacks. For instance, electron-beam lithography has low throughput, x-ray lithography has difficulties with fabricating suitable masks, and ion-beam lithography has low throughput and difficulties with obtaining reliable ion sources.

One problem that arises with imaging of a wafer using a plurality of reticle images is the difficulty of achieving a suitable registration between the image fields on the semiconductor wafer. In particular, structures in different reticle fields are typically connected by overlapping of continuous lines that span the exposure fields of several reticles. Errors in registration can cause a connecting line between exposure fields to become laterally displaced and, therefore, disconnected. For electrically conductive structures, such as polysilicon and conductive metals, that are intended to form a conductive loop in a continuous circuit, a disconnection between structures constitutes an open circuit. For an electrically conductive loop having a registration error that does not result in a disconnected but rather a significantly attenuated line width, the line resistance may be substantially elevated, thereby impacting the performance of the circuit. In addition, a metal line such as an aluminum line that is significantly narrowed may become susceptible to high resistance or open lines due to electromigration. Disconnected lines and narrowed lines caused by misregistration between reticle image fields are typically stitched by depositing metal contacts over the ends of line segments. This approach disadvantageously requires additional processing steps for depositing and etching the metal contacts.

The difficulty in achieving an adequate registration between reticle images is magnified for structures, such as global interconnect structures, that extend over multiple reticle images on a semiconductor wafer. Conventional techniques for connecting multiple circuit areas involve slicing of individual circuit dies into individual integrated circuits, dicing the circuit dies into separate integrated chips, gluing the separate integrated circuits into a single structure, and wire-bonding the glued integrated circuits to make interconnections. Unfortunately, such a fabrication process is time-intensive and costly. Furthermore, this fabrication process causes the breakage of many circuits during dicing and destruction of the circuits during gluing and wire-bonding fabrication steps.

What is needed is a cost and time-efficient technique for interconnecting multiple circuit regions extending over a large portion of a semiconductor wafer.

SUMMARY OF THE INVENTION

In accordance with the present invention, each circuit block of a plurality of circuit blocks on a semiconductor substrate is imaged in an exposure field defined by a reticle. The circuit blocks are separated and electrically isolated within the semiconductor substrate by an isolation such as a field oxide or trench isolation. The circuit blocks are globally interconnected by depositing a blanket metal layer, masking the metal layer and etching the metal layer using a stitching reticle having an exposure field overlapping the plurality of circuit blocks. The combination of reticle-imaged circuit blocks allows each individual circuit block to be fabricated independently, using independent imaging resolution, layout rules, design rules, different polysilicon sizes and source/drain region sizes and the like. In addition different reticles, including different reticle types, resolutions and qualities may be used to construct the various circuit blocks. Different imaging technologies may be used to construct the independent circuit blocks, including X-ray, I-line, H-line, ion-beam and electron-beam irradiation, for example. While the different circuit blocks are independently constructed, the circuit blocks are globally interconnected using the blanket metal layer so that overall circuit size is reduced, circuit quality is enhanced, fabrication time and costs are reduced, and performance is increased.

Also in accordance with an embodiment of the present invention, a plurality of integrated chip sets, including microprocessor, memory, and support chips, are constructed on a single semiconductor wafer using separate reticle imaging of each of the plurality of integrated chip sets. The different circuits are globally interconnected using a blanket metal layer that is imaged using a stitch mask and etch operation that combines and electrically connects the individual integrated chips.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings. The appended drawings illustrate the general concepts of a suitable fabrication method but are not necessarily drawn to scale. Analogous or similar structures may be designated by the same reference number in the drawings.

FIGS. 1A and 1B through 5A and 5B, are respectively a top plan view (FIGS. 1A through 5A) and a corresponding cross-sectional view (FIGS. 1B through 5B) showing successive processing steps of a method for stitching two circuit fields.

DESCRIPTION OF THE PREFERRED EMBODIMENT(S)

Figure 1A:
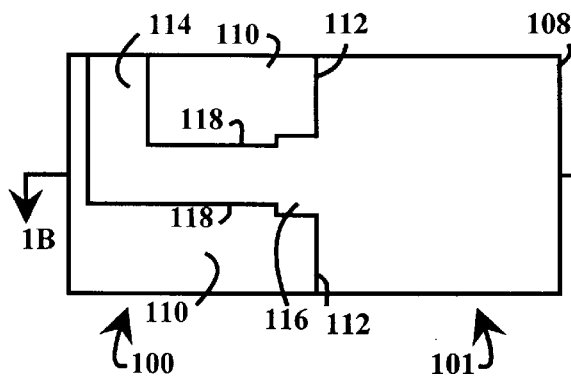
Figure 1B:
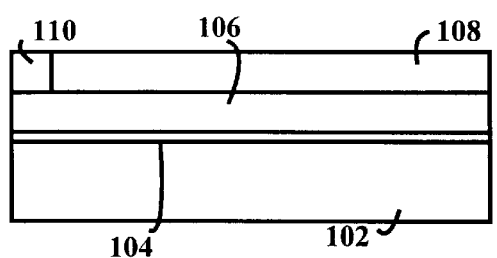

Referring to a sequence of paired FIGS. 1A and 1B through 5A and 5B, a top plan view (FIGS. 1A through 5A) and a corresponding cross-sectional view (FIGS. 1B through 5B) are illustrated for successive processing steps of a method for stitching two circuit fields, a field A 102 and a field B 104. In FIGS. 1A and 1B, a silicon substrate 108 is covered by a layer of gate oxide 110. Overlying the gate oxide 110 is a layer of polysilicon 112. A photoresist layer 114 is formed on the surface of the gate oxide layer 110. A first image pattern 116 is etched into the photoresist layer 114. The first image pattern 116 is bounded by an outer border 118 and defines a first segment 120 and a contact region 122 between irradiated regions of the first image pattern 116.

In one embodiment, the silicon substrate 108 is suitable for integrated circuit fabrication and includes a P-type epitaxial surface layer with a <100> orientation, a thickness of $8\mu$ and a resistivity of 12 $\Omega$-cm. The epitaxial surface layer is formed on a P+ base layer (not shown). The gate oxide layer 110 typically is composed from silicon dioxide and is formed on the top surface of the silicon substrate 108 using tube growth at a temperature of from 700° C. to 1000° C. in an $O_2$ ambient. The gate oxide layer 110 typically has a thickness in a range from 30 Å to 150 Å. The polysilicon layer 112 is not doped and is deposited to a thickness of 1500 Å to 2500Å by low pressure chemical vapor deposition on the surface of the gate oxide layer 110. The polysilicon layer 112 may be doped subsequently, either in situ during deposition or prior to etching, for example by implanting arsenic with a dosage in a range from $1\times10^{15}$ to $5\times10^{15}$ atoms/cm$^2$ and an energy in a range from 2 to 50 kiloelectron-volts. The photoresist layer 114 is typically deposited on the polysilicon layer 112 as a continuous layer and selectively irradiated using a photolithographic system (not shown), such as a step-and-repeat optical projection system. The step-and-repeat optical projection system, for example, may project I-line ultraviolet light from a mercury-vapor lamp through a reticle and a focusing lens to illuminate the first image pattern 116 on the photoresist layer 114. In other embodiments, other illuminating systems such as electron-beam and x-ray illumination systems may be employed, depending on the integrated circuits to be fabricated.

In one embodiment, the first segment 120 has a line width (LW) of about 3500 Å. The contact region 122 has a width (W) of about 5500 Å and a length (L) of approximately 2000 Å. In the illustrative embodiment, the first segment 120 is centered in the y-direction with respect to the contact region 122 so that the contact region 122 protrudes about 1000 Å beyond adjoining sidewalls 124 of the first segment 120.

Figure 2A:
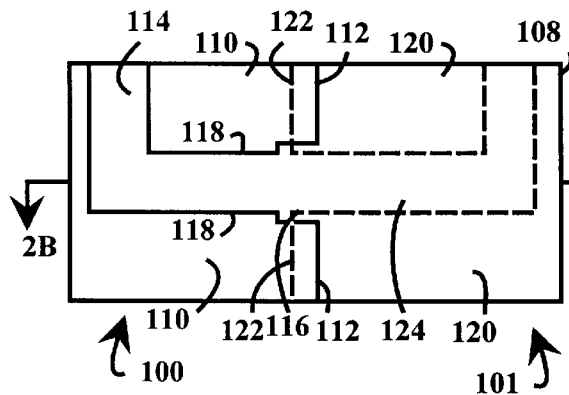
Figure 2B:
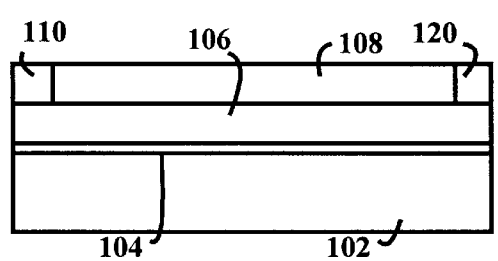

The irradiation for projecting the first image pattern 116 is terminated and, in a second irradiation step shown in FIGS. 2A and 2B, the photoresist layer 114 is again selectively irradiated, for example using the step and repeat system, and a second image pattern 216 is projected onto the photoresist layer 114. Thus the first image pattern 116 and the second image pattern 216 are projected using separate exposure steps with the first image pattern 116 projected onto the photoresist layer 114, the exposure discontinued, and then the second image pattern 216 is projected onto the photoresist layer 114. The second image pattern 216 has an outer border 218 and defines a second segment 220 between irradiated regions of the second image pattern 216. One end of the second segment 220 is adjacent to the outer border 218. Outer borders 118 and 218 are mutually parallel and offset by a selected length in the x-direction so that image patterns 116 and 216 partially overlap between the outer borders 118 and 218. The first segment 120 and the second segment 220 are mutually misaligned with respect to one another in both the x-direction and the y-direction. The second segment 220 is positioned to extend into the contact region 122 to form an electrical contact between the field A 102 and the field B 104.

In one embodiment, outer borders 118 and 218 are mutually parallel and offset by approximately 500 Å in the x-direction. First segment 120 and second segment 220 are displaced in the x-direction by approximately 1500 Å and displaced in the y-direction by about 500 Å so that the second segment 220 extends about 500 Å into the contact region 122 and is spaced from the upper edge of the contact region 122 by about 500 Å and spaced from the lower edge of the contact region 122 by about 1500 Å. The entire end of the second segment 220 overlaps the contact region 122 so that the contact region 122 accommodates the misalignment between the first segment 120 and the second segment 220 and assures that the stitching between segments 120 and 220 has a linewidth of about 3500 Å.

Figure 3A:
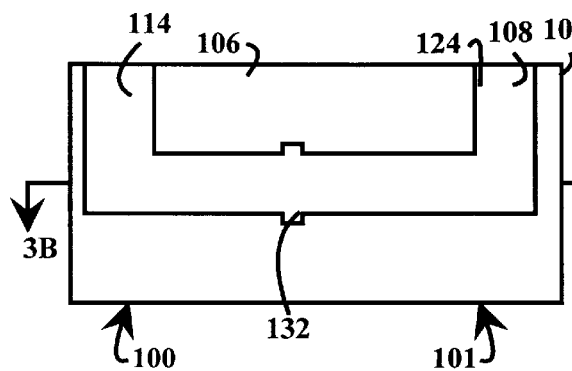
Figure 3B:
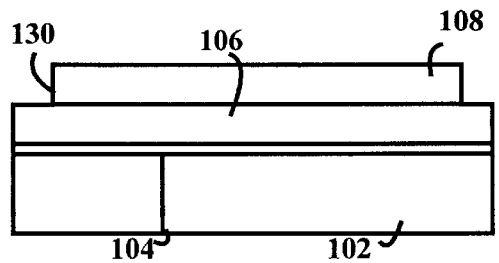

Referring to FIGS. 3A and 3B, the photoresist layer 114 is developed. The photoresist layer 114 is positive-acting to that portions of the photoresist layer 114 that are irradiated by the first image pattern 116, the second image pattern 216, or both image patterns 116 and 216 are removed. The removed areas of the photoresist layer 114 leave openings 310 that selectively expose a portion of the polysilicon layer 112 which correspond to the first image pattern 116 and the second image pattern 216. The portion of the photoresist layer 114 that remains after patterning covers the first segment 120, the second segment 220, and a portion 312 of the contact region 122. Portion 312 of the contact region 122 is outside the outer border 218. A portion 314 of the contact region 122 inside the outer border 218 corresponds, or is converted, to the end of the second segment 220, where the second segment 220 overlaps the contact region 122.

Figure 4A:
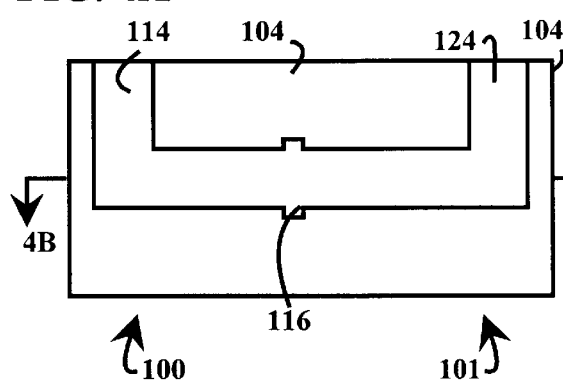
Figure 4B:
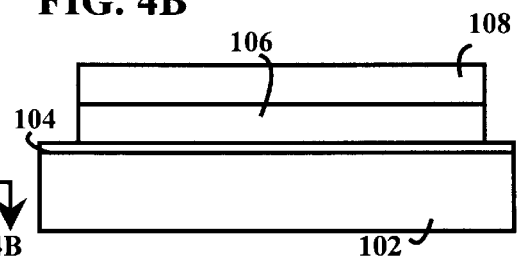

Referring to FIGS. 4A and 4B, an anisotropic dry etch that is highly selective of the polysilicon layer 112 is applied through the openings 310. The photoresist layer 114 protects the underlying polysilicon layer 112 from the etch while the exposed portion of the polysilicon layer 112 is etched and removed. The anisotropic etch is highly selective of polysilicon and non-selective of silicon dioxide so that only a negligible amount of the gate oxide layer 110 beneath the exposed portion of the polysilicon layer 112 is removed. The silicon substrate 108 is not etched by the anisotropic etch.

Figure 5A:
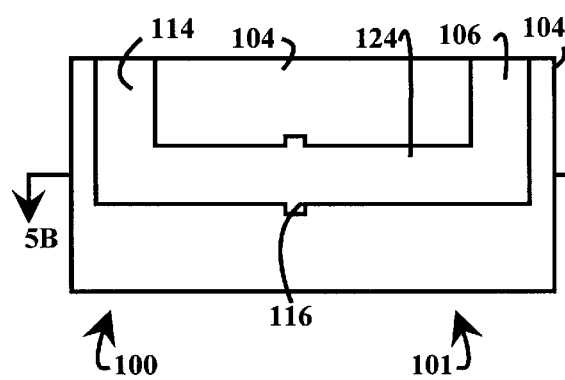
Figure 5B:
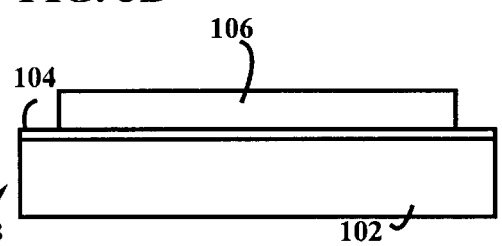

Referring to FIGS. 5A and 5B, the photoresist layer 114 is stripped. The first segment 120 and the second segment 220 are stitched by the portion 312 of the contact region 122 to form a continuous circuit despite possible misalignment between the segments 120 and 220. In one embodiment, the segments 120 and 220 are stitched to form a continuous minimum linewidth of approximately 3500 Å despite any misalignment between the segments.

Various other embodiments of the method disclosed in paired FIGS. 1A and 1B through 5A and 5B, which are described more fully in the copending U.S. Patent Application entitled, "Method of Stitching Segments Defined by Adjacent Image Patterns During the Manufacture of a Semiconductor Device," serial no. XX/xxx,xxx <atty. docket no.: M-3958 US>, naming H. Jim Fulford, Jr. et al. as inventors and filed on even date herewith. In various embodiments, for example, the images for field A 102 and field B 104 are patterned in a reversed order. The first and second segments are formed in sequence using two photoresist layers, rather than being formed simultaneously using a single photoresist layer. In another embodiment, the segments and the contact region are fabricated as trenches formed in silicon beneath the image patterns, rather than protruding regions of polysilicon outside the image patterns.

Figure 6A:
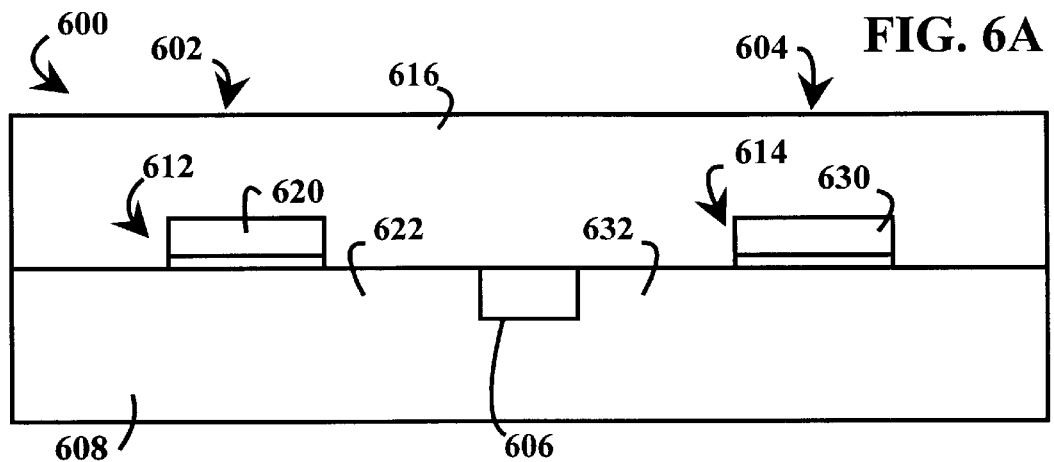
FIGS. 6A through 6E are a sequence of cross-sectional diagrams of a semiconductor wafer during processing for combining a plurality of fields defined by a reticle image using segment stitching.

FIGS. 6A through 6E are a sequence of cross-sectional diagrams of a semiconductor wafer 600 during processing for combining a plurality of fields defined by a reticle image using segment stitching. Referring to FIG. 6A, a cross-sectional view of a semiconductor wafer 600 shows a field A 602 and a field B 604. Field A 602 and field B 604 are formed using separate masking steps as is depicted in paired FIGS. 1A and 1B through 5A and 5B for one or more reasons. For example, field A 602 and field B 604 may be formed in different masking steps because the combination of fields is too large for masking using a single reticle. Alternatively, field A 602 and field B 604 may be fabricated using different resolution and quality reticles, or different layout rules, design rules or illumination technologies (for example, x-ray, ion-beam and electron-beam illumination). Furthermore, macrochips including a variety of circuit fields such as a microprocessor, a DRAM storage, an SRAM storage and the like may be fabricated using a plurality of reticles, masked and etched in separate processing sequences for the plurality of circuit fields. In other circuits, different circuit structures may be fabricated in the plurality of circuit fields such as a block of P-channel transistors and a block of N-channel transistors in a static RAM circuit.

Although each field typically includes a plurality of devices and structures, a transistor A 612 and transistor B 614 are shown in FIGS. 6A through 6E for illustrative purposes since a discussion of two devices fully but concisely describes the improved method.

Field A 602 and field B 604 are separated by an isolation 606 which in various embodiments is a trench isolation or a field oxide isolation. The isolation 606 is formed to mutually isolate the fields of a multiple-field semiconductor wafer. A field oxide isolation is formed by thermal growth on the silicon substrate 608, for example by wet oxidation at temperatures of around 1000° C. for 2 to 4 hours to grow field oxide thickness of $0.8\mu$–$1.0\mu$. A trench isolation may take the form of a single trench or multiple trenches. For example, if shallow trench isolation is used, multiple trenches are advantageously employed to assure a sufficient isolating fill. A trench or plurality of trenches is etched and the trenches are filled, for example using a LOCOS fill, a deposited oxide fill, i.e. TEOS, or a spin-on-glass (SOG) for filling narrow trenches. A suitable trench isolation has a thickness in a range from approximately $1\mu$ to about $100\mu$.

The devices, transistor A 612 and transistor B 614 are previously formed in different masking steps using suitable device processing steps including formation of gate oxide, gate polysilicon, source/drain and isolation. For example, in one embodiment the field A 602 is masked and etched in a first sequence of steps and the field B 604 is masked and etched in a second sequence of steps. Masking of field A 602 and field B 604 are mutually independent, by projecting radiation respectively through a reticle A (not shown) and, at a different time, through a reticle B (not shown). The reticle A and the reticle B are typically different reticles, although in some embodiments, the same reticle may be used to mask both field A 602 and field B 604, although separate mask steps are necessary since multiple exposures are used to form a desired circuit size. Both the printing of field A 602 and field B 604 are performed with a controlled registration tolerance.

The transistor A 612 includes a gate 620 and a source/drain region 622 implanted into a substrate 608. The transistor B 614 includes a gate 630 and a source/drain region 632 implanted into the substrate 608. A dielectric layer 616 is deposited overlying the devices transistor A 612 and transistor B 614. The dielectric layer 616 is deposited as a continuous layer overlying the silicon substrate 608.

In one embodiment, the gate is formed by applying a first photoresist mask on the gate material and etching a first portion of the gate material through the opening in the first mask. The first photoresist mask is then removed and a second photoresist mask is formed on the gate material so that a second portion of the gate material is etched through the opening in the second mask. In this embodied method, the first and second edges of the gate electrode are formed in sequence. An advantage of this etching procedure is that the gate electrode can have an extremely narrow length of approximately $0.1\mu$ or less.

Following formation of the gate electrode, source and drain regions are formed by implanting dopants of a conductivity type (P or N) which is complementary (N or P) to the conductivity type of the semiconductor substrate using a patterned gate as a mask. The source and drain regions are thus self-aligned to the gate electrode, improving packing density and reducing parasitic overlap capacitances between the gate electrode and the source and drain. The polysilicon gate electrode also receives the proper dopants with this implant.

Photolithographic techniques are commonly used to create patterns in the photoresist mask that define the gate electrode. Typically, the wafer is cleaned and prebaked to drive off moisture and promote adhesion, an adhesion promoter is deposited on the wafer, a few milliliters of photoresist are deposited onto the spinning wafer to provide a uniform layer, the wafer is soft baked to drive off remaining solvents, the wafer is put into a photolithographic system and exposed to a radiation pattern, and then the photoresist is developed.

Positive photoresist is typically used so that the developer removes the irradiated regions. The photoresist is hard-baked to improve resistance, and then the wafer is doped using an additive process, such as ion implantation, or a subtractive process, such as etching, using the photoresist as a mask. The photoresist is then stripped.

Figure 6B:
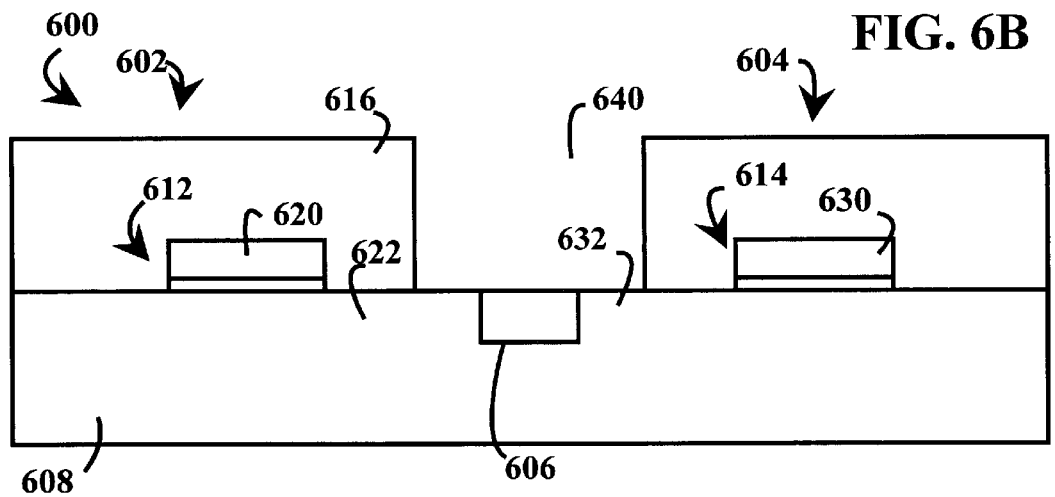
Figure 7:
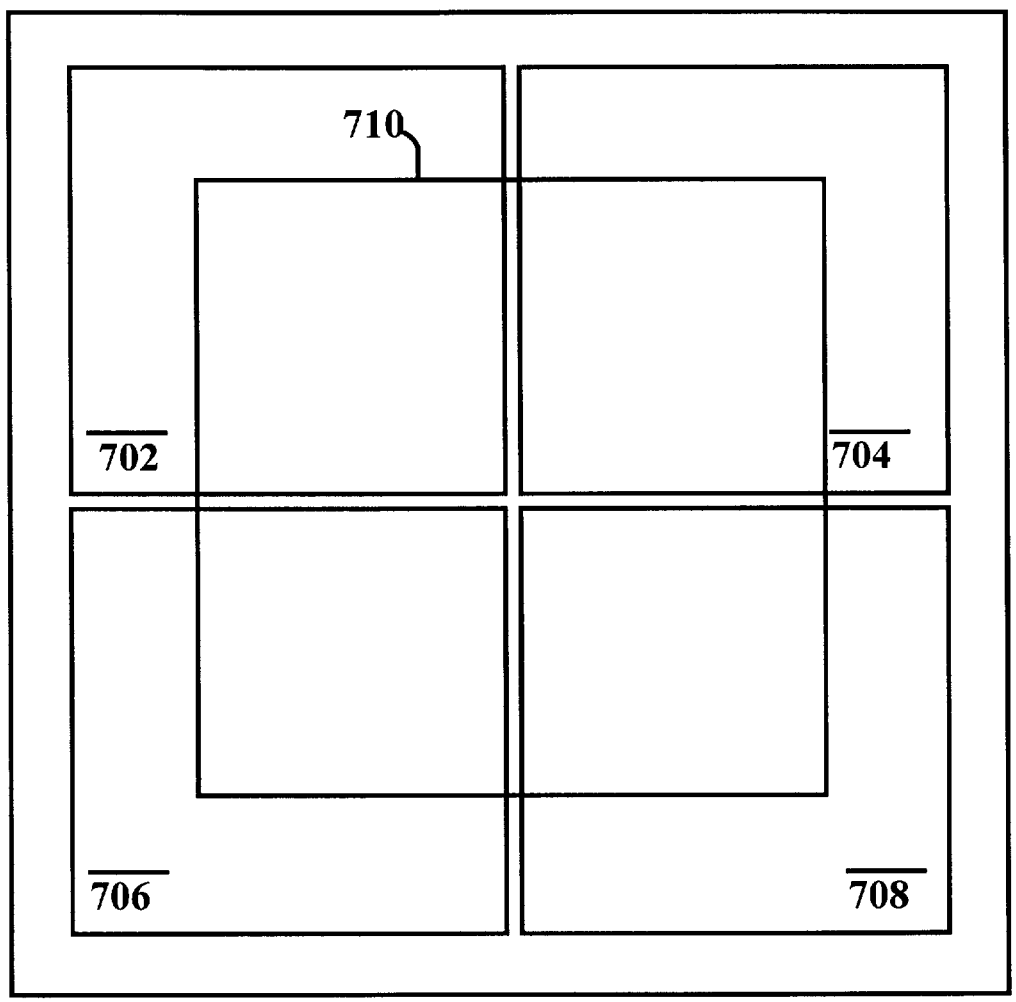
FIG. 7 is an overhead view of a semiconductor wafer showing four fields or regions which may use a stitch mask that covers all four fields to connect the fields.

Referring to FIG. 6B, a cross-sectional view of the semiconductor wafer 600 shows a field A 602 and a field B 604 following masking and etching of the dielectric layer 616 using a stitch mask which is applied in accordance with the technique disclosed in the discussion of paired FIGS. 1A and 1B through 5A and 5B. The stitch mask and etch operation is applied throughout the entire wafer surface or in a portion of the wafer surface in various applications. The dielectric layer 616 is deposited as a continuous layer and is irradiated using a photolithographic system. In one embodiment of a fabrication method, the photolithographic system is a step and repeat optical projection system where I-line ultraviolet light from a mercury-vapor lamp is projected through a reticle and a focusing lens to imposed a selected image pattern in the dielectric layer 616. The stitch mask overlaps both the field A 602 and the field B 604. In some embodiments, the stitch mask covers both the field A 602 and the field B 604. In embodiments including many circuit fields, the stitch mask may cover all fields. For example, an overhead view of a semiconductor wafer 700 shown in FIG. 7 shows four fields A 702, B 704, C 706, and D 708 which may use a stitch mask 710 that covers all four fields. In other embodiments, the stitch mask covers a same size area, a large area, or a smaller area than the area of a single of the fields A 602 and B 604 but is positioned to overlap field A 602 and field B 604.

The stitch mask is applicable in circumstances in which field A 602 and field B 604 are formed using different masks. If field A 602 and field B 604 can be formed using a single mask, a stitch mask is not necessary.

In various embodiments, the stitch mask is applied using a reticle that has the same resolution as the reticles for masking field A 602 and field B 604 or a different resolution. In some embodiments, field A 602 and field B 604 are masked using a 4× or 5× reticle. A stitch mask that covers both the entire field A 602 and field B 604 may, for example, be applied using a large 1× reticle. A large 1× reticle does not attain the resolution of a 4× or 5× reticle, but the registration tolerances to be attained by the stitch mask are not critical in comparison to the tolerances in the field A 602 and the field B 604.

Portions of the dielectric layer 616 are removed to form openings including a via 640 in the dielectric layer 616. The dielectric layer 616 is etched to selectively expose the source/drain regions of transistors so that the source/drain regions are subsequently connected. In the illustrative example, the source/drain region 622 of transistor A 612, the source/drain region 632 of transistor B 614 and the isolation 606 separating field A 602 and field B 604 are uncovered by etching of the dielectric layer 616. The dielectric layer 616 is masked using a stitch mask traversing a plurality of separately masked field areas A 602 and B 604 and etched to form the via 640 for making a local interconnect between devices transistor A 612 and transistor B 614 crossing the isolation 606.

Figure 6C:
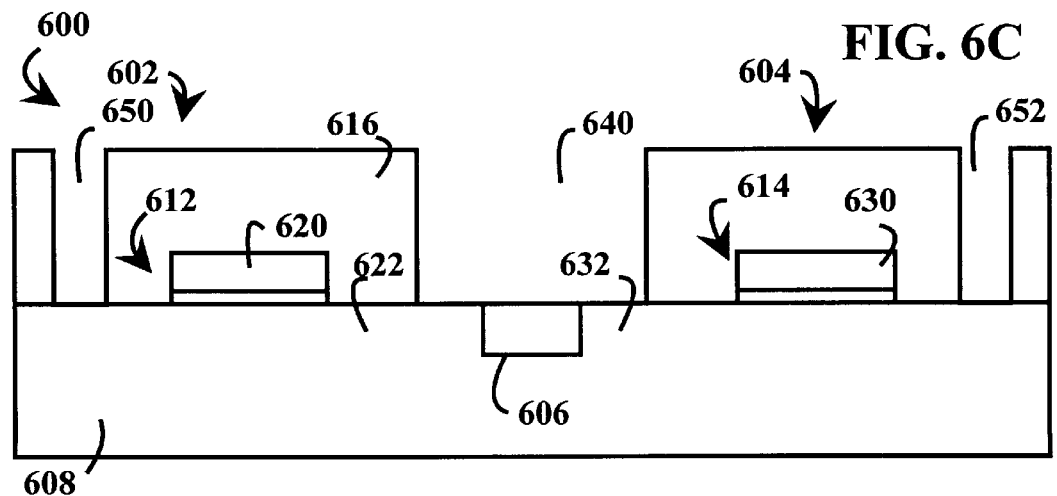

Referring to FIG. 6C, a cross-sectional view of the semiconductor wafer 600 shows a field A 602 and a field B 604 following masking and etching of the dielectric layer 616 using two contact masks, one applied to field A 602 and one applied to field B 604. The contact mask steps are performed to form a contact via 650 to transistor A 612 and a contact via 652 to transistor B 614.

Figure 6D:
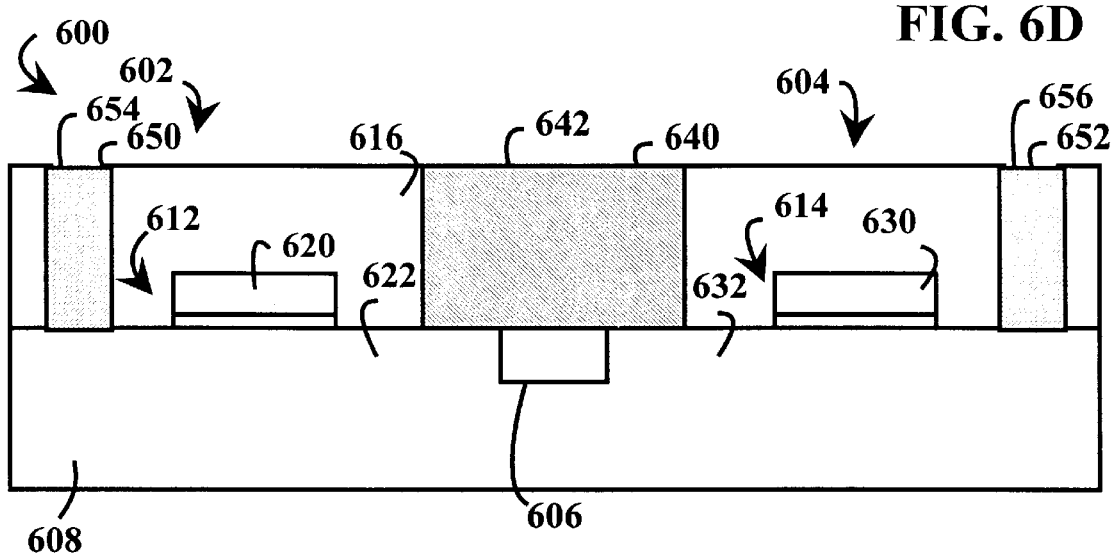

Referring to FIG. 6D, a metal plug 642 is formed in the via 640 formed by etching following application of the stitch mask and metal plugs 654 and 656 are also formed in the respective vias 650 and 652 formed by the contact mask and etch steps. The metal plugs are typically formed from tungsten or aluminum. The metal plug 642 forms a low impedance local interconnect between source/drain regions of transistors in separately masked and etched fields A 602 and B 604. The metal plugs 654 and 656 are formed using a suitable technique such as a CVD deposition followed by chemical-mechanical polishing (CMP), simultaneous deposition of a metal-1 layer and the plug film followed by two-mask patterning of the plug and metal-1 lines, or etching of the plugs from a thin metal film using contrast-enhancement lithography.

Subsequent processing of the metal plugs depends on the circuit application. In some embodiments, a polishing step such as a chemical-mechanical polishing (CMP) is applied after formation of the metal plugs. CMP involves simultaneous chemically etching and mechanical polishing or grinding of a surface so that a combined chemical reaction and mechanical polishing removes a desired material from the substrate surface in a controlled manner. The resulting structure is a planarized substrate surface with protruding surface topography leveled. CMP is typically performed by polishing a substrate surface against a polishing pad that is soaked with a slurry including an acidic or basic solvent, an abrasive agent and a suspension fluid. In other embodiments, polishing is not performed and the metal plug 642 is simply filled and capped with a topside metal layer. In some embodiments, the metal plug 642 is deposited and planarized or formed by a continuous aluminum fill.

Figure 6E:
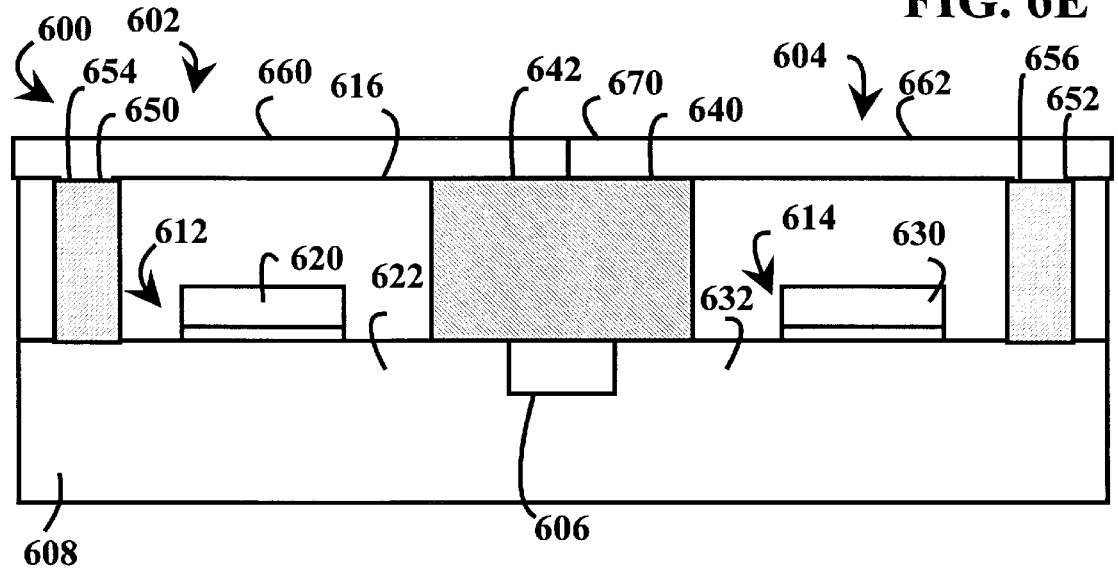

Referring to FIG. 6E, a cross-section view of the semiconductor wafer 600 illustrates the formation of a metal line A 660 printed on the field A 602 and a metal line B 662 printed on the field B 604, forming a local-interconnect layer 670 by depositing a metal such as aluminum or tungsten and defining the layer. In one embodiment, the metal line A 660 and the metal line B 662 are formed by deposition of hot aluminum, tungsten or other suitable metal and polished. The metal line A 660 and the metal line B 662 may be deposited by chemical vapor deposition (CVD), sputter-deposition, or by evaporated-film deposition. CVD deposition attains a better step coverage. CVD of tungsten is typically performed in either a hot-wall, low-pressure CVD system or a cold-wall, low-temperature system. The tungsten is selectively deposited from either $WF_6$ or $WCl_6$ using hydrogen reduction-blanket CVD W deposition and etch-back. CVD of aluminum is typically performed by pyrolysis of triisobutyl aluminum (TIBA) or by selective deposition through thermal decomposition of TIBA.

Figure 8:
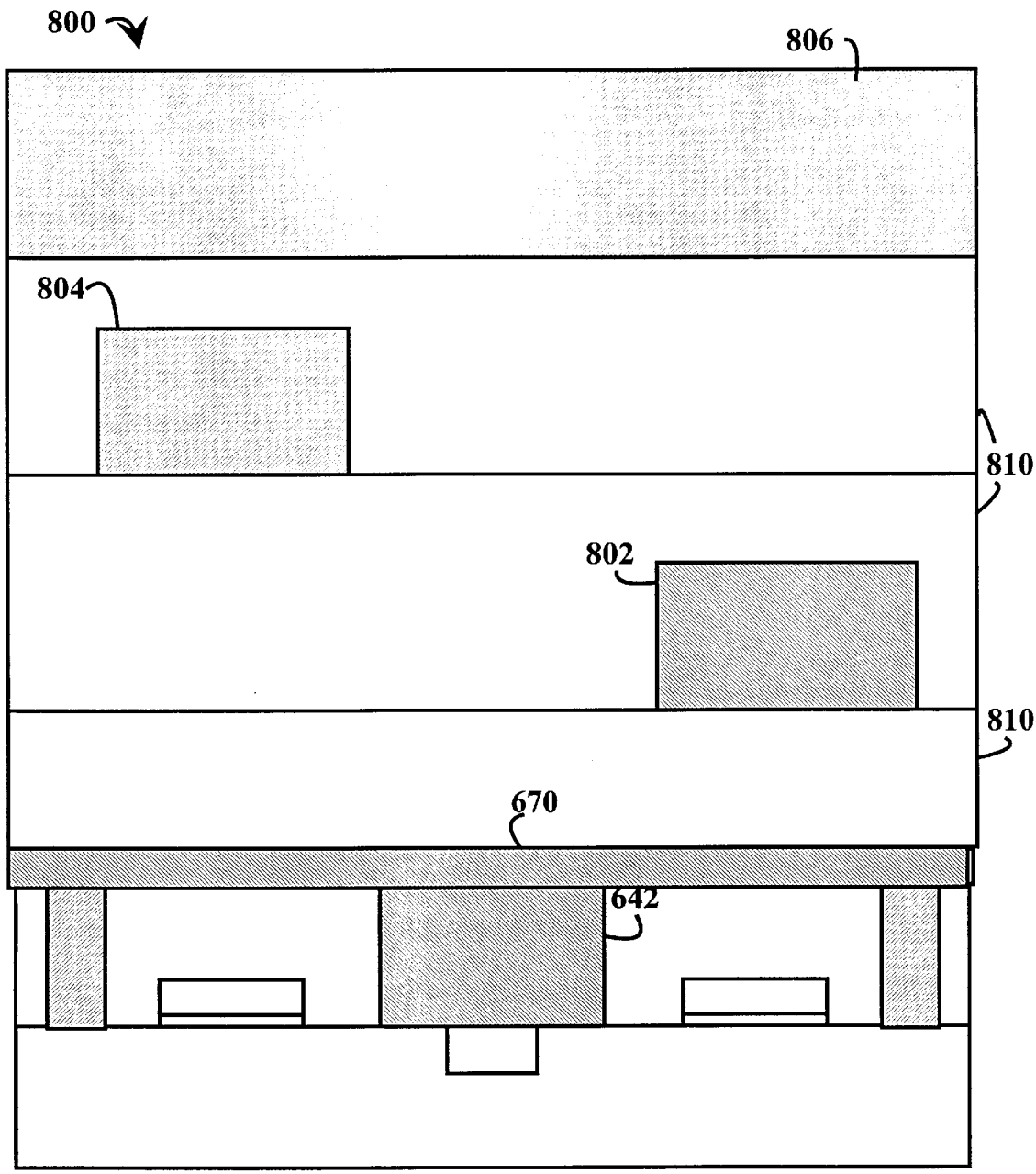
FIG. 8 is a cross-sectional view of a semiconductor wafer having a multiple-level interconnect structure in accordance with an embodiment of the present invention.

Referring to FIG. 8, a cross-sectional view of a semiconductor wafer 800 having a multiple-level interconnect structure is shown. In the illustrative example, the semiconductor wafer 800 has a five-level-metal structure in which the first and second metal layers include the metal plug 642 and the local-interconnect layer 670 shown in FIG. 6. Plugs are stacked to form an interconnection between conductors that are separated by more than one layer. The intermetal dielectric layers are planarized prior to deposition of subsequent metal layers.

The semiconductor wafer 800 also includes a metal-three layer 802, a metal-four layer 804 and a metal-five layer 806, which are separate by a plurality of intermetal dielectric layers 810. The metal-three layer 802 and metal-four layer 804 are layers of multiple levels of metal which are deposited and interconnected by vias. The vias and metal layers are respectively filled and formed using various suitable techniques including conventional via fabrication and formation of metal-to-metal contacts through the vias. Typically, the formation of metal-to-metal contacts is attained by physical vapor deposition, metal film sputtering, and creation of a post or pillar which is then surrounded with a dielectric, for example. Contact holes and vias are completely filled by processes including chemical vapor deposition (CVD) of tungsten or aluminum, bias-sputtered planarized aluminum, laser-planarized aluminum, plug formation or selective electroless deposition.

The multiple-level metal layers including metal plug 642, local-interconnect layer 670, metal-three layer 802, metal-four layer 804 and metal-five layer 806, are electrically isolated by intermetal dielectric layers 810. Typically, the intermetal dielectric layers 810 are constructed from doped CVD silicon dioxide films, such as silane-based CVD $SiO_2$ films, which are advantageously flowed and reflowed at temperatures greater than 800° C. The intermetal dielectric layers 810 may also be formed from other suitable materials such as low temperature TEOS films, PECVD borosilicate glass (BSG), PECVD silicon nitrides, bias-sputtered $SiO_2$, polyimides, and spin-on glasses.

The intermetal dielectric layers 810 are planarized to reduce variability in topography throughout the wafer surface, increasing the planarity of the wafer topography to improve step coverage of metal lines, reduce the formation of metal stringers during etching operations and accommodate depth-of-field limitations of submicron optical-lithography tools. Various planarization techniques are typically employed including deposition of a intermetal dielectric layers that is thicker than the maximum step height of the planarized surface, deposition of a liquid polyimide film as an intermetal dielectric layer that fills crevices and produces a flat surface, and deposition of CVD $SiO_2$ with bias-sputter etchback. Other planarization techniques include planarization of CVD intermetal dielectric films using an sacrificial-layer etchback technique, application of liquid spin-on glass (SOG) films composed of siloxanes or silicates, chemical-mechanical polishing (CMP), and glass flow and etchback techniques.

Figure 9A:
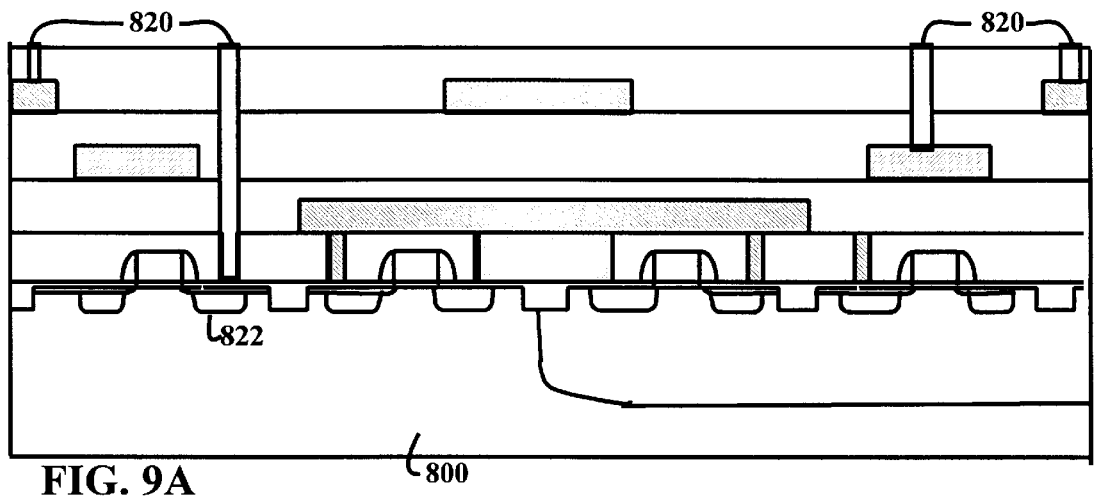
FIGS. 9A through 9D are a plurality of cross-sectional views of a semiconductor wafer showing process steps for forming a master layer to combine individually-printed blocks of a circuit pattern.
Figure 9B:
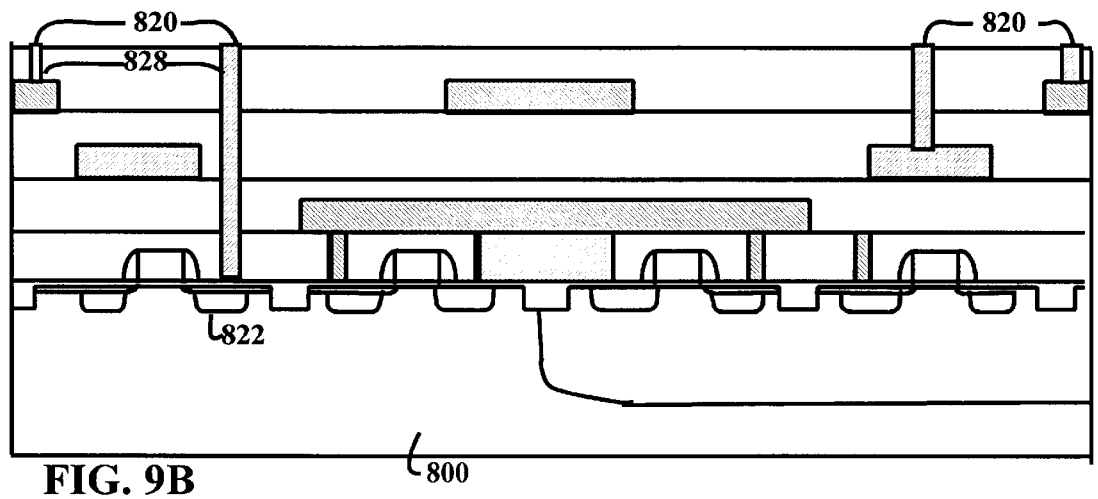
Figure 9C:
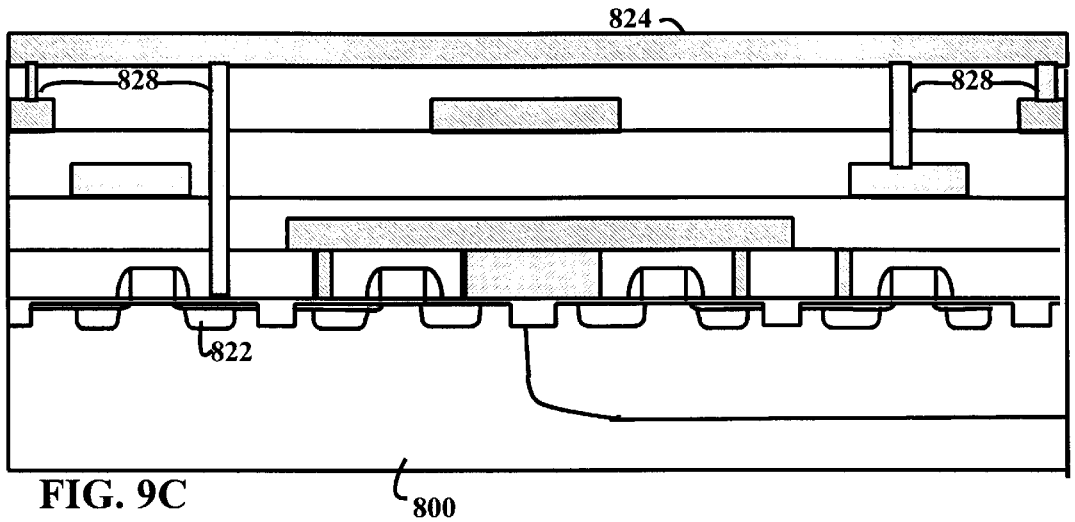
Figure 9D:
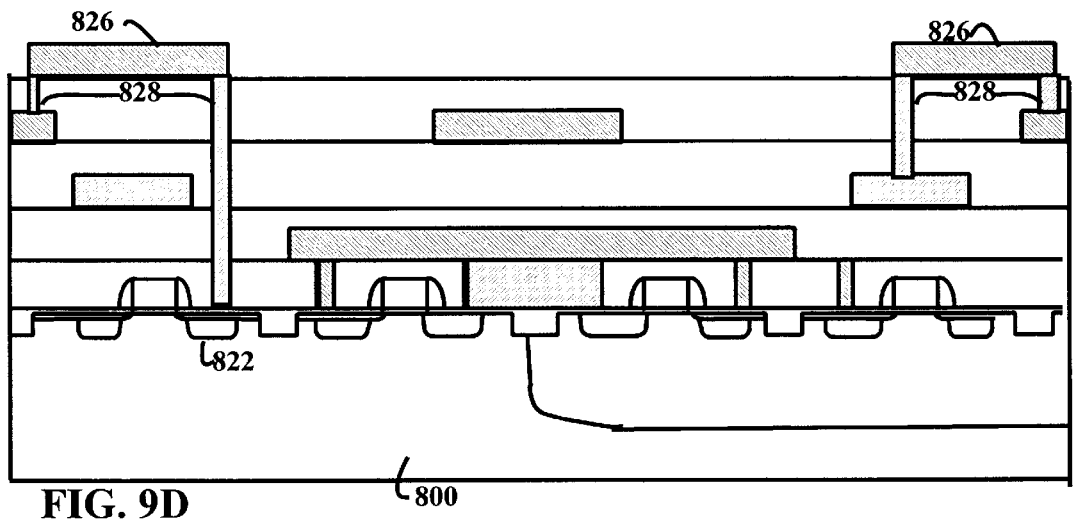

The metal-five layer 806 is deposited as a blanket metal layer which is deposited across a plurality of separately imaged regions of the semiconductor wafer 800. In the illustrative embodiment, the metal-five layer 806 is printed using a 1× reticle having an imaging field that extends across the entire semiconductor wafer 800. Referring to FIGS. 9A through 9E, a plurality of cross-sectional views of a semiconductor wafer depict process steps for forming a master layer 830 to combine individually-printed blocks of a circuit pattern. The master layer 830 is typically a metal layer, such as an aluminum or tungsten layer, although the master layer 830 may be constructed of other materials, such as polysilicon. Each metal layer is formed using a multiple-step process. FIG. 9A shows a step of patterning and etching the semiconductor wafer 800 to form vias 820 to selected structures at lower levels. One such selected structure is a source/drain region 822 in the semiconductor wafer 800. FIG. 9B illustrates a step of filling the vias 820 with a metal plug 828, such as a tungsten plug, using a suitable technique. Chemical vapor deposition (CVD) is one such suitable technique. In FIG. 9C, the entire semiconductor wafer 800 is covered with a conductive metal layer 824, such as an aluminum layer. In FIG. 9D, the semiconductor wafer 800 is patterned and etched to leave a continuous connection line 826 for connecting various structures. The metal connections lines 826 are connected by a stitching operation.

Using this process, the master layer 830 combine individually-printed blocks of a circuit pattern. The master layer 830 is constructed of a metal, such as aluminum, to extend throughout a plurality of individually-printed circuit regions on the semiconductor wafer 800. The master layer 830 is printed using a larger reticle than the individually-printed blocks.

In some embodiments, multiple metal layers are stitched in different directions. For example, two metal layers, such as metal layers 5 and 6, may be stitched at right angles.

Figure 10:
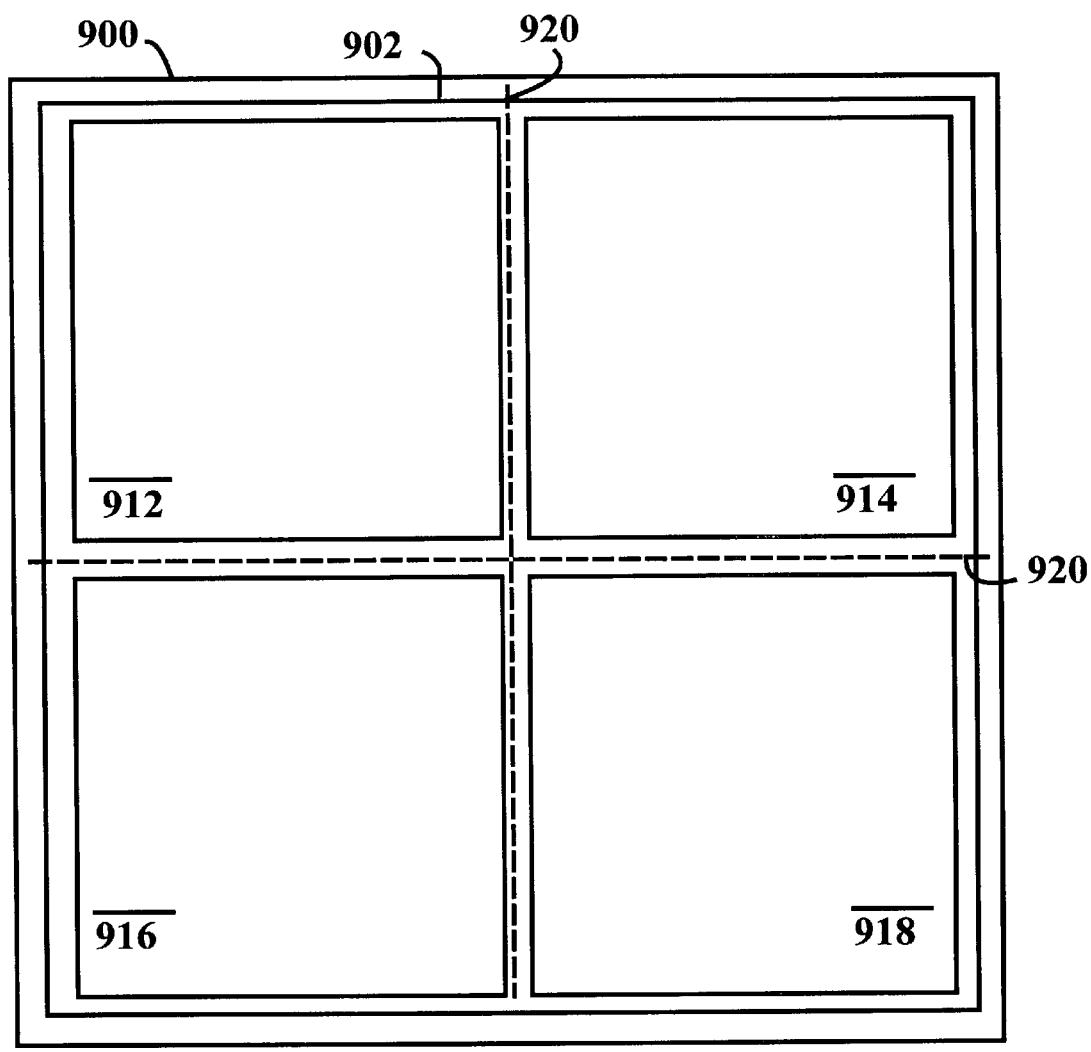
FIG. 10 is an overhead view of a semiconductor wafer showing four individually printed blocks of a circuit pattern that are combined and interconnected using a blanket metal layer.

FIG. 10 is an overhead view of a semiconductor wafer showing four individually printed circuit blocks A 912, B 914, C 916, and D 918 of a circuit pattern that are combined and interconnected using a blanket metal layer 902 extending over the surface of an entire semiconductor wafer 900. Each of the circuit blocks A 912, B 914, C 916, and D 918 is masked, exposed, printed and etched independently of the other circuit blocks. Isolation lines 920 are formed into the semiconductor wafer 900 to form a grid void of circuitry where connections are subsequently made to separate integrated circuit sections for the circuit blocks A 912, B 914, C 916, and D 918. The individual circuit blocks A 912, B 914, C 916, and D 918 are constructed using independently-selected reticles for imaging, imaging resolution, design rules, and other design and structural parameters. The individual circuit blocks A 912, B 914, C 916, and D 918 are covered by a single metal layer and the metal layer is masked using a single high resolution reticle or mask that covers all of the portions of the semiconductor wafer 900 corresponding to the positions of the circuit blocks A 912, B 914, C 916, and D 918. In this manner the entire surface of the semiconductor wafer 900 is stitched.

The individual circuit blocks A 912, B 914, C 916, and D 918 are divided into independent die at the isolation lines 920. The individual circuit blocks A 912, B 914, C 916, and D 918 are mutually isolated within the semiconductor substrate (not shown) by isolation structures (not shown) such as field oxide or trench isolation structures. Local interconnections are made between the circuit blocks A 912, B 914, C 916, and D 918 by structures such as the metal plug 642 and the local-interconnect layer 670 shown in FIG. 6. Global interconnections are made using a blanket metal, specifically the metal-five layer 806 shown in FIG. 8.

For example, in one embodiment the circuit blocks A 912, B 914, C 916, and D 918 correspond respectively to a microprocessor, a dynamic RAM (DRAM) memory, a static RAM (SRAM) memory and a support integrated circuit. The microprocessor, a dynamic RAM (DRAM) memory, a static RAM (SRAM) memory and a support integrated circuit are each masked and etched using a separate reticle. Local interconnections are made between the different circuit blocks A 912, B 914, C 916, and D 918 for communicating various signals in a low level (for example, metal-1, metal-2 or metal-3 levels) of a metal stack using metal plugs and a local-interconnect layer 670. High-level metal stack connections, such as the metal-five layer 806, are printed using a 1× reticle having an imaging field that extends across the entire semiconductor wafer 900 and makes global interconnections between the circuit blocks A 912, B 914, C 916, and D 918 such as power bus or major signal bus connections. The high-level metal stack connections are formed using a reticle having a sufficiently large area of coverage to extend beyond two or three regions formed using a small-erarea reticle and having local-area connections. The local-area connections are made using a stitch mask which is formed in accordance with the technique disclosed in the discussion of paired FIGS. 1A and 1B through 5A and 5B.

The circuit blocks A 912, B 914, C 916, and D 918 may be fabricated using different resolution and quality reticles, or different layout rules, design rules or illumination technologies (for example, x-ray, ion-beam and electron-beam illumination). The circuit blocks A 912, B 914, C 916, and D 918 may include multiple different circuit fields such as a microprocessor, a DRAM storage, an SRAM storage and the like and may be fabricated using a plurality of reticles, masked and etched in separate processing sequences for the plurality of circuit fields.

While the invention has been described with reference to various embodiments, it will be understood that these embodiments are illustrative and that the scope of the invention is not limited to them. Many variations, modifications, additions and improvements of the embodiments described are possible. For example, although the illustrative connections are made with source/drain regions of transistors, the disclosed method is applicable to structures other than source/drain regions and transistor devices. Any interconnections made be made using the disclosed method.

What is claimed is:

1. A method of fabricating an integrated circuit comprising the steps of:
    fabricating a plurality of electronically and spatially independent device regions extending laterally on a substrate wafer, the semiconductor device regions being electrically isolated by an isolation;
    individually patterning the regions of the plurality of device regions;
    etching the plurality of device regions in accordance with the individual patterning of the regions;
    depositing an insulating layer overlying the plurality of device regions on the substrate wafer;
    forming a plurality of patterned vias extending through the insulating layer to selected locations of the plurality of device regions;
    depositing a conductive material in the vias electrically-coupled to the selected locations of the plurality of device regions; and
    depositing a conductive master layer overlying the insulating layer and extending laterally overlying the plurality of device regions, the conductive master layer electrically-coupling to the conductive material in the vias.

2. A method according to claim 1, further comprising the steps of:
    patterning the conductive master layer using a pattern extending laterally over the spatially independent device regions; and
    etching the conductive master layer in accordance with the patterning.

3. A method according to claim 2, further comprising the steps of:
    stitching the conductive master layer to form connections among the plurality of spatially independent device regions.

4. A method according to claim 1, wherein the conductive master layer forms a power bus.

5. A method according to claim 1, wherein the conductive master layer forms a global signal line.

6. A method according to claim 1, wherein the plurality of mutually disconnected and nonoverlapping semiconductor device regions are individually masked using a reticle and lens confining a mask image to the corresponding semiconductor device region.

7. A method according to claim 1 further comprising the steps of:
    patterning the conductive master layer using a pattern extending laterally over the spatially independent device regions; and
    etching the conductive master layer in accordance with the patterning;
    wherein the conductive master layer is patterned using a reticle and lens generating a mask image overlapping a plurality of the disconnected and nonoverlapping semiconductor device regions.

8. A method according to claim 1 further comprising the steps of:
    patterning the conductive master layer using a pattern extending laterally over the spatially independent device regions; and
    etching the conductive master layer in accordance with the patterning;
    wherein:
        the plurality of electronically and spatially independent device regions are individually masked using a reticle and lens confining a mask image to the corresponding semiconductor device region;
        the conductive master layer is patterned using a reticle and lens generating a mask image overlapping a plurality of the disconnected and nonoverlapping semiconductor device regions; and
        the device region reticles and the overlapping reticle have the same resolution.

9. A method according to claim 1 further comprising the steps of:
    patterning the conductive master layer using a pattern extending laterally over the spatially independent device regions; and
    etching the conductive master layer in accordance with the patterning;
    wherein:
        the plurality of electronically and spatially independent device regions are individually masked using a reticle and lens confining a mask image to the corresponding semiconductor device region;
        the conductive master layer is patterned using a reticle and lens generating a mask image overlapping a plurality of the disconnected and nonoverlapping semiconductor device regions; and
        the resolution of the device region reticles is higher than resolution of the overlapping reticle.

10. A method according to claim 1 wherein the step of fabricating a plurality of electronically and spatially independent device regions includes the step of fabricating a plurality of different integrated circuits including a microprocessor and a memory.

11. A method of fabricating an integrated circuit comprising the steps of:
   independently fabricating a plurality of laterally and electrically separate integrated circuit regions on a substrate wafer using independent imaging of the separate integrated circuit regions;
   depositing a conductive master layer on the substrate overlying the plurality of laterally and electrically separate integrated circuit regions; and
   patterning the conductive master layer using a single imaging extending over a plurality of laterally and electrically separate integrated circuit regions.

12. A method according to claim 11, further comprising the steps of:
   etching the conductive master layer in accordance with the patterning; and
   stitching the conductive master layer to form connections among the plurality of spatially independent device regions.

13. A method according to claim 11, wherein the conductive master layer is a metal layer.

14. A method according to claim 11, wherein the conductive master layer is a polysilicon layer.

15. A method according to claim 11, wherein the conductive master layer forms a power bus.

16. A method according to claim 11, wherein the conductive master layer forms a global signal line.

17. A method according to claim 11, wherein the plurality of laterally and electrically separate integrated circuit regions are individually masked using a reticle and lens confining a mask image to the corresponding integrated circuit region.

18. A method according to claim 11 further comprising the steps of:
   patterning the conductive master layer using a pattern extending laterally over the separate integrated circuit regions; and
   etching the conductive master layer in accordance with the patterning;
   wherein the conductive master layer is patterned using a reticle and lens generating a mask image overlapping a plurality of the disconnected and nonoverlapping separate integrated circuit regions.

19. A method according to claim 11 further comprising the steps of:
   patterning the conductive master layer using a pattern extending laterally over the laterally and electrically separate integrated circuit regions; and
   etching the conductive master layer in accordance with the patterning;
   wherein:
      the plurality of laterally and electrically separate integrated circuit regions are individually masked using a reticle and lens confining a mask image to the corresponding semiconductor device region;
      the conductive master layer is patterned using a reticle and lens generating a mask image overlapping a plurality of the disconnected and nonoverlapping semiconductor device regions; and
      the device region reticles and the overlapping reticle have the same resolution.

20. A method according to claim 11 wherein the step of fabricating a plurality of laterally and electrically separate integrated circuit regions includes the step of fabricating a plurality of different integrated circuits including a microprocessor and a memory.

* * * * *